(12) United States Patent
Miettinen et al.

(10) Patent No.: US 7,320,359 B2
(45) Date of Patent: Jan. 22, 2008

(54) LIQUID COOLING ELEMENT AND CONNECTION ARRANGEMENT OF LIQUID COOLING ELEMENT

(75) Inventors: Osmo Miettinen, Vaasa (FI); Matti Pussinen, Laihia (FI)

(73) Assignee: Vacon Oyj, Vaasa (FI)

( * ) Notice: Subject to any disclaimer, the term of this patent is extended or adjusted under 35 U.S.C. 154(b) by 484 days.

(21) Appl. No.: 10/856,831

(22) Filed: Jun. 1, 2004

(65) Prior Publication Data

US 2005/0039886 A1 Feb. 24, 2005

(30) Foreign Application Priority Data

Jun. 4, 2003 (FI) .............................. 20030838 U (51) Int. Cl.
*F28F 3/12* (2006.01)
(52) U.S. Cl. ................... 165/70; 165/80.4; 165/168; 361/699
(58) Field of Classification Search ............... 165/70, 165/80.4, 168
See application file for complete search history.

(56) References Cited

U.S. PATENT DOCUMENTS

| | | | | |
|---|---|---|---|---|
| 1,602,287 A | * | 10/1926 | Spencer ..................... 165/70 |
| 1,818,387 A | * | 8/1931 | Dinzl ......................... 165/168 |
| 1,884,612 A | * | 10/1932 | Dinzl ......................... 165/168 |
| 1,929,824 A | * | 10/1933 | Polley ........................ 165/168 |
| 1,980,627 A | * | 11/1934 | Leach ......................... 165/70 |
| 2,877,992 A | * | 3/1959 | Niemi ......................... 165/74 |
| 4,210,199 A | * | 7/1980 | Doucette et al. ............. 165/70 |
| 5,339,892 A | * | 8/1994 | Clifton ........................ 165/82 |
| 5,871,042 A | * | 2/1999 | Gutfeldt et al. .............. 165/70 |
| 6,032,726 A | * | 3/2000 | Wright et al. ............. 165/109.1 |

FOREIGN PATENT DOCUMENTS

EP 0 514 840 A2 11/1992

* cited by examiner

*Primary Examiner*—Allen J. Flanigan
(74) *Attorney, Agent, or Firm*—Oliff & Berridge, PLC (57) ABSTRACT

The invention relates to a liquid cooling element for cooling heat generating elements of frequency converters, in particular, and an arrangement for connecting the liquid cooling element. The liquid cooling element 2 is provided with two channel systems: horizontal channels 3, 4 and transverse channels 5 connecting said horizontal channels. The liquid cooling element 2 is characterized by consisting of one integral piece, the transverse channels 5 being arranged eccentrically to the horizontal channels 3, 4 such that the longitudinal axis of the transverse channel 5 is closer to the lateral face of the cooling element than the longitudinal axis of the horizontal channel 3, 4 and the outer edge of the transverse channel 5 extends closer to the lateral face of the cooling element than the outer edge of the horizontal channel 3, 4. The liquid cooling element is connected to protect the liquid cooling against leakage such that around the pipes supplying cooling liquid into the horizontal channels there is arranged a second pipe 22, 23 having a larger diameter.

11 Claims, 8 Drawing Sheets

LIQUID COOLING ELEMENT AND CONNECTION ARRANGEMENT OF LIQUID COOLING ELEMENT

FIELD OF THE INVENTION

The present invention relates to cooling of controllable electric drives, particularly frequency converters, by means of a liquid cooling element. Cooling of this kind protects an electrical device and enables efficient cooling.

BACKGROUND OF THE INVENTION

To some extent liquid cooling has been applied to cool controllable electric drives, such as frequency converters, using ionized water, for instance. In that case it is possible to allow liquid to come into contact with electric circuits.

But, when some other liquid, such as ordinary water, is used, the liquid circulation must be kept apart from the electric circuits and this has caused problems in positioning the elements. Leaks may occur in liquid-filled pipes, which may cause hazardous situations and equipment failures.

A cooling element, in which water is circulated to conduct heat away from the electrical device, should be manufactured to resist the pressure of water and also to resist forces exerted on it without allowing the water to come into contact with the electric circuits.

The water used for cooling may contain impurities, due to which the cooling power may reduce as cooling channels get blocked. Conventional cooling elements may be structures closed by welding, for instance, and it may be difficult to clean them and to check how clean they are. It may also occur that the channel systems fill with air, which is difficult to detect, and which also reduces the cooling power.

BRIEF DESCRIPTION OF THE INVENTION

The object of the present invention is to provide a liquid cooling element that is reliable in operation and easier to maintain for a controllable electric drive, in particular for a frequency converter, and an arrangement for connecting said element.

In accordance with the present invention, this is achieved by the liquid cooling element and the arrangement for connecting the liquid cooling element having the characteristics defined in the claims. More precisely, the liquid cooling element and the arrangement for connecting the liquid cooling element are characterized by what is disclosed in the characterizing parts of the independent claims.

The preferred embodiments of the invention are disclosed in the dependent claims.

The liquid cooling element of the invention is provided with two channel systems: horizontal channels for conducting the cooling liquid into the cooling element and away therefrom and transverse channels for connecting the horizontal channels. In accordance with the invention, the transverse channels are arranged eccentrically to the horizontal channels such that the longitudinal axis of a transverse channel is closer to the lateral face of the cooling element than the longitudinal axis of a horizontal channel.

In addition to this, the transverse channels are arranged eccentrically to the horizontal channels such that the outer edge of a transverse channel extends closer to the lateral face of the cooling element than the outer edge of a horizontal channel, whereby eccentricity contributes to suction effect which sets an air bubble in the channel system, if any, in motion and no deaeration is needed.

The connection arrangement of the above liquid cooling element is based on the idea that on feed pipes used in liquid cooling there is arranged a second pipe, by means of which leakage in the pipe or in a joint thereof can be detected without risking the operation of the apparatus.

The transverse channels of the liquid cooling element are perpendicular to the longitudinal direction of the horizontal channels and extend at one end beyond a second horizontal channel up to the outer edge of the cooling element so as to facilitate maintenance and cleaning. Thus, the transverse channels and the horizontal channels can be machined in the liquid cooling element by drilling, for instance.

The transverse channels can be closed at the outer edge of the cooling element with a tightly arranged maintenance cover that can be secured to the cooling element with screw-like means, for instance. The cooling element is arranged to comprise a maintenance cover that is provided with a seal arranged on the lower surface of the maintenance cover with sealing means. It is possible to use O-rings to seal the securing of the maintenance cover and to close the transverse channels. As each transverse channel is closed with the screw-like means and the O-ring, the maintenance cover mounted on top thereof serves to lock the lower screw-like means into place further ensuring the tightness of the liquid cooling element.

The liquid cooling element consisting of one piece is made of heat conductive material, such as aluminium, and heat generating elements are connectable thereto.

In addition to the operation of the above-described frame structure, the present structure is characterized by a simple, modifiable solution. For instance, the length and size of the horizontal channels can be modified to vary the flow. The number, diameter and positioning of the transverse channels can also be readily modified in accordance with the placement of the cooling elements.

It shall be noted that the horizontal channels and the transverse channels may also be in other than horizontal or vertical position with respect to their base. The essential thing is that the transverse channels act as channels connecting the horizontal channels.

Because the transverse channels can be serviced through the maintenance cover, it is also possible to close some of the transverse channels by placing in said transverse channel a piece, for instance an aluminium bar of suitable size, that blocks the flow in said transverse channel, if no cooling is desired in the area of those transverse channels. Thus, the flow rate increases in other channels, which enhances heat discharge from the element. This allows further improved focusing of the cooling of the elements. Advantageously the transverse channels are arranged on both sides of the cooling element but they may be located on one side only, if elements to be cooled are positioned on one side of the cooling element only.

The cooling element is large and provides sufficient mass for cooling. In addition, the walls between the cooling liquid and the electric elements must be sufficiently thick to resist the stresses, to which the walls are subjected. Sufficient thickness facilitates the securing of elements to be cooled, because the securing can be performed with screw-like securing means that allow easy and safe securing. Previously, large size has been a drawback, but when the cooling element serves as the frame of the apparatus, it is possible to achieve a structure that is more robust and cools better than the previous frame structures without having to increase the size of the apparatus.

Because the applications and conditions vary, the need for cooling varies in different elements. Thus, there is also need to cool some parts more than others. To focus the cooling to critical areas would often be most desirable.

It should be noted that the cooling element itself may have a sufficiently large mass to cool smaller frequency converters. On the other hand, when the application environment is such that liquid cooling cannot be used, or there is a need to enhance it, a conventional cooling element, such as a cooling rib, can be readily secured to one side of the cooling element made of aluminium to enhance the cooling.

It should be noted that when the application environment is such that liquid cooling cannot be used, air from outside can also be readily conducted to the lateral faces of the cooling element made of aluminium or the pipe system thereof to enhance the cooling.

The connection arrangement of the liquid cooling element is based on the idea that on feed pipes used in liquid cooling there is arranged a second pipe, by means of which leakage in the pipe or in a joint thereof can be detected without risking the operation of the apparatus.

In the connection arrangement of the liquid cooling the length of the protective pipe may vary according to need, but the intention is to lead the leaking water through the protective pipe into a sewage system, for instance. It is advisable to install the protective pipe both on the inlet and outlet sides of the liquid. Installation applications often vary, whereby the liquid cooling pipes are often made of flexible material and sharp edges and the like may thus break them. The protective pipe may be made of plastic, for instance, and thus it provides additional protection for the actual cooling pipe.

The arrangement comprises horizontal channels for conducting the cooling liquid into the cooling element and away therefrom, and transverse channels for connecting the horizontal channels. Around the pipes conducting the cooling liquid into the horizontal channels there is arranged a second, protective pipe having a larger diameter, which conducts the liquid in case of leakage to a desired distance from electrical devices.

BRIEF DESCRIPTION OF THE DRAWINGS

The attached drawings show a preferred embodiment of a liquid cooling element according to the invention and arrangements for connecting the liquid cooling element, wherein.

DETAILED DESCRIPTION OF THE INVENTION

An embodiment of a liquid cooling element will be described with reference to FIGS. 1 to 4.

Figure 2:
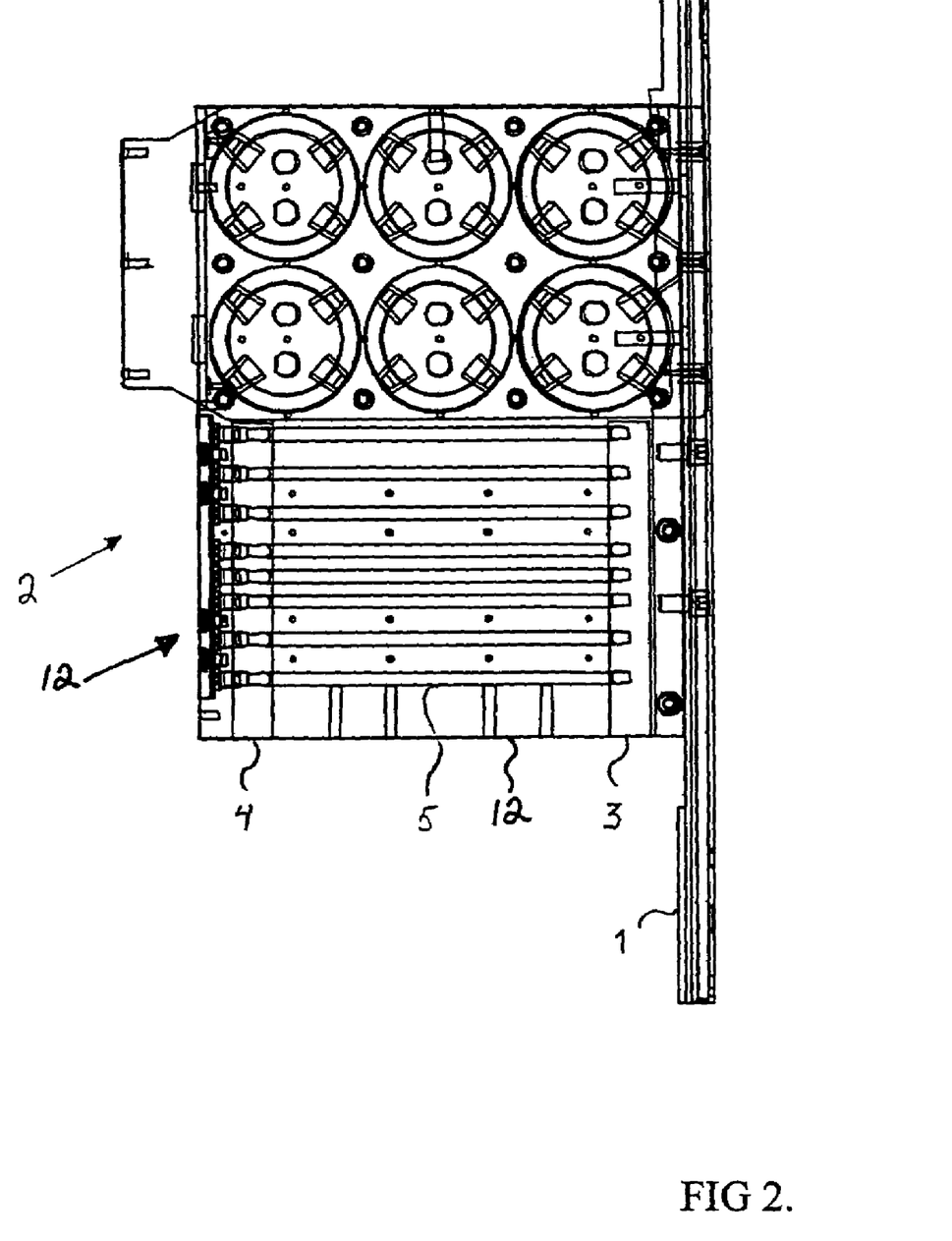
FIG. 2 is a partial sectional side view of the liquid cooling element.
Figure 3:
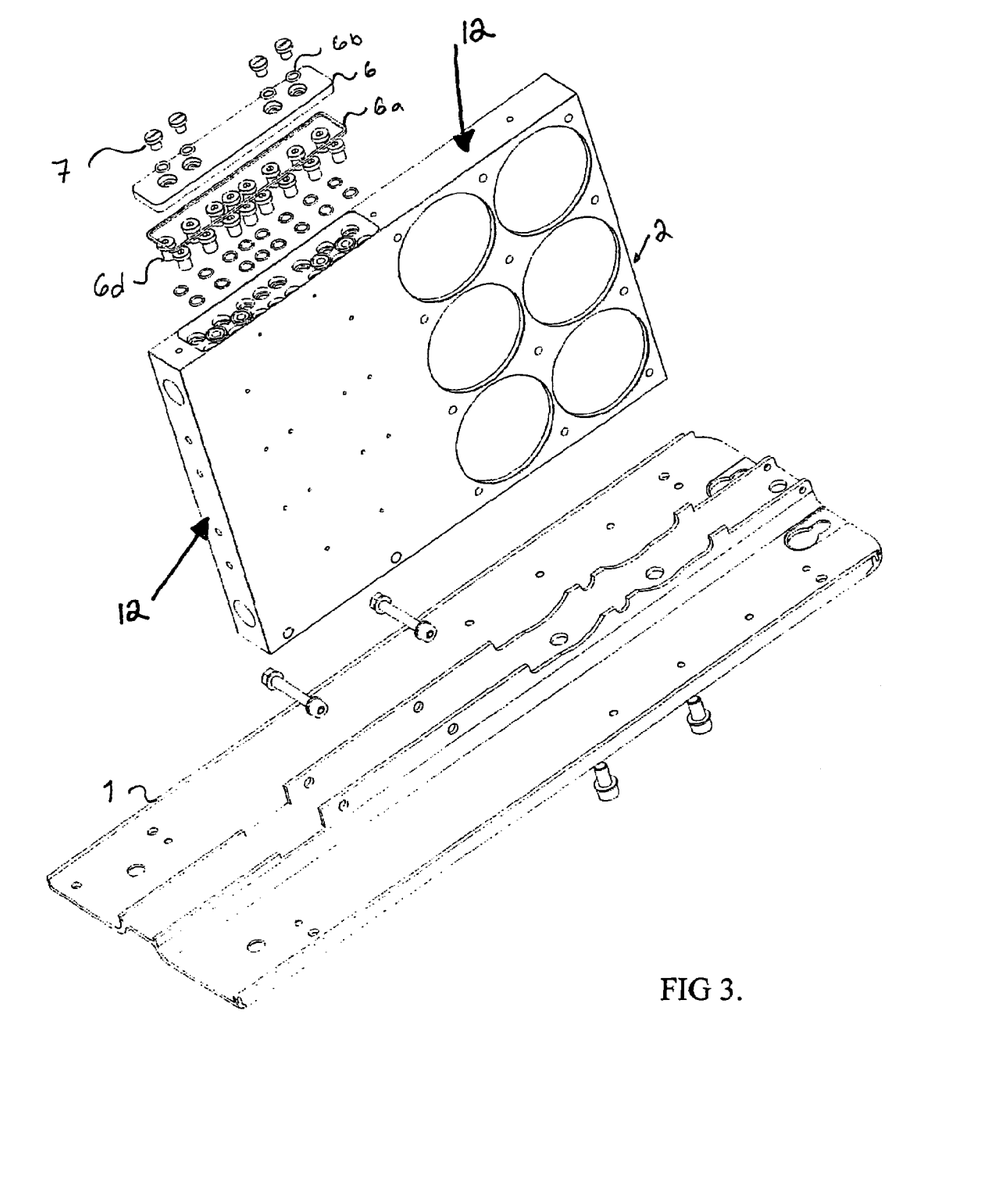
FIG. 3 is a partial view of the liquid cooling element of the invention seen obliquely from above.
Figure 4:
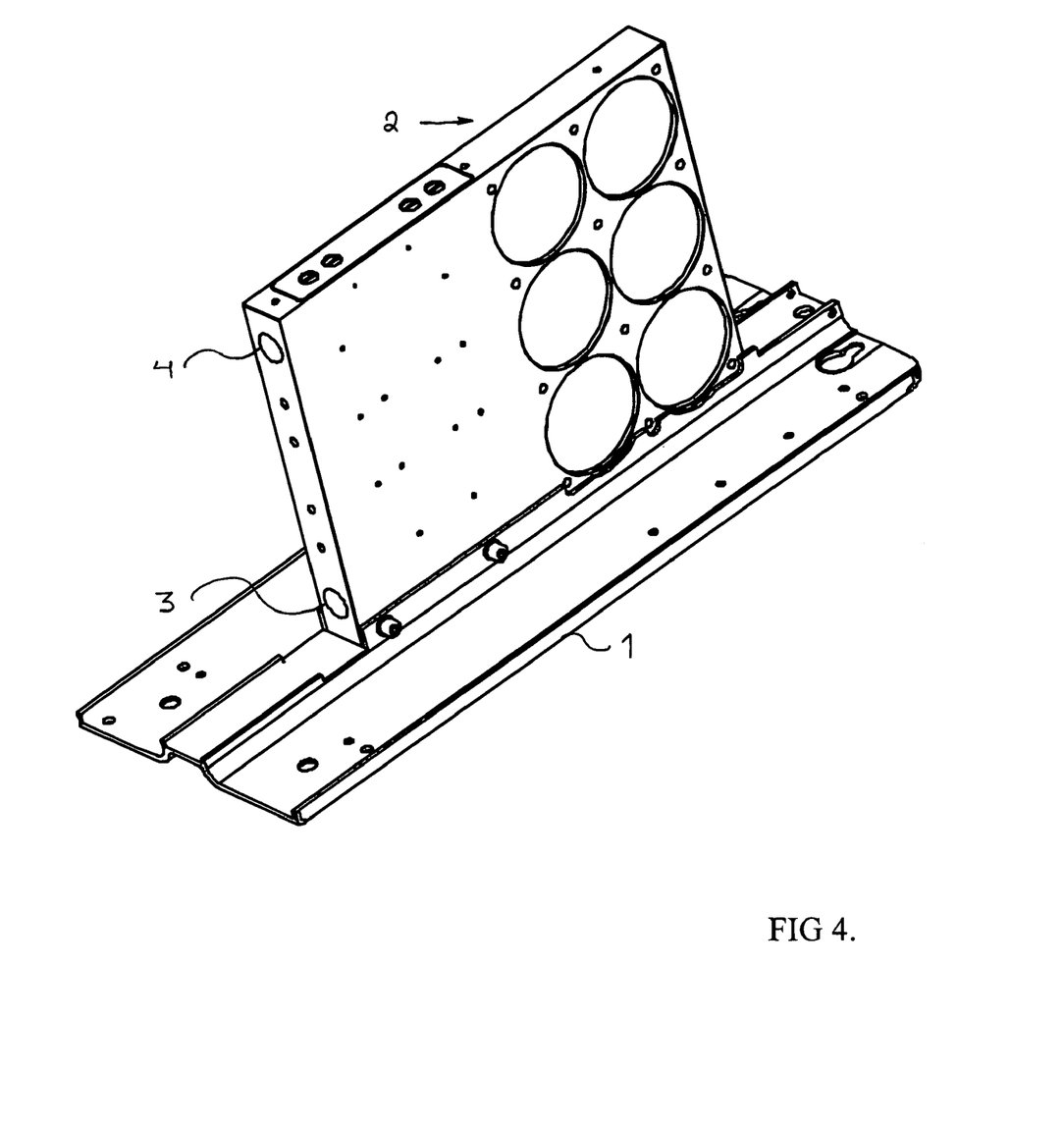
FIG. 4 shows the liquid cooling element of FIG. 3 assembled and secured to its base, seen obliquely from above.

In accordance with FIGS. 2, 3 and 4 the liquid cooling element 2 is secured to a base 1. The base 1 material can be an aluminium profile, for instance.

Figure 1:
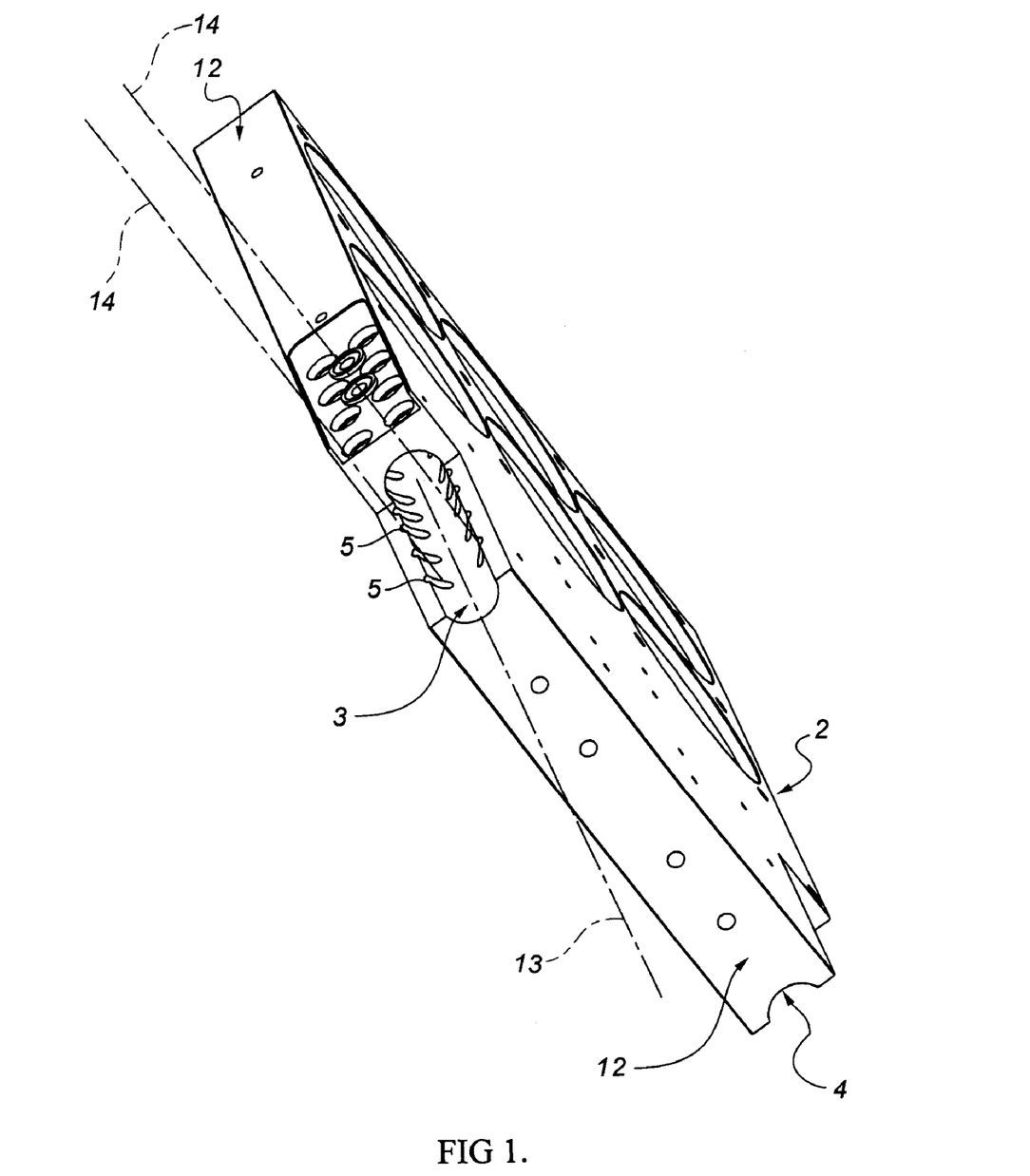
FIG. 1 shows a liquid cooling element seen obliquely from above, parts of the cooling element being removed for better illustrating the pipe systems.

FIG. 1 shows the liquid cooling element 2, from which parts have been removed for better illustrating the channel systems. In FIGS. 1 and 2 it is possible to see transverse channels 5 connecting horizontal channels 3, 4. The horizontal channels 3, 4 are arranged to conduct the cooling liquid into the cooling element 2 and away therefrom and the horizontal channels are arranged to connect the transverse channels 5. In accordance with the invention the transverse channels 5 are arranged eccentrically to the horizontal channel system 3, 4 such that the longitudinal axis 14 of the transverse channel 5 is closer to the lateral face 12 of the cooling element than the longitudinal axis 13 of the horizontal channel.

Additionally, it appears from FIG. 1 that the transverse channels 5 are arranged eccentrically to the horizontal channel system 3, 4 such that the outer edge of the transverse channel extends closer to the lateral face 12 of the cooling element than the outer edge of the horizontal channel, whereby eccentricity contributes to suction effect, which sets an air bubble in the channel system, if any, in motion and no deaeration is needed.

It appears from FIGS. 1, 3 and 4 how a recess is arranged by machining at the end of the transverse channels in the cooling element, in which recess a maintenance cover 6 can be placed. The transverse channels 5 can be closed at the outer edge of the cooling element with a tightly arranged maintenance cover 6 that can be secured to the cooling element 2 with screw-like means 6d. The cooling element is arranged to comprise a maintenance cover that is provided with a seal 6a arranged on the lower surface of the maintenance cover with sealing means. It is possible to use O-rings 6b to seal the securing of the maintenance cover and to close the transverse channels. As each transverse channel is closed with the screw-like means 6d and the O-ring, the maintenance cover mounted on top thereof serves to lock the lower screw-like means into place further ensuring the tightness of the liquid cooling element.

Figure 5:
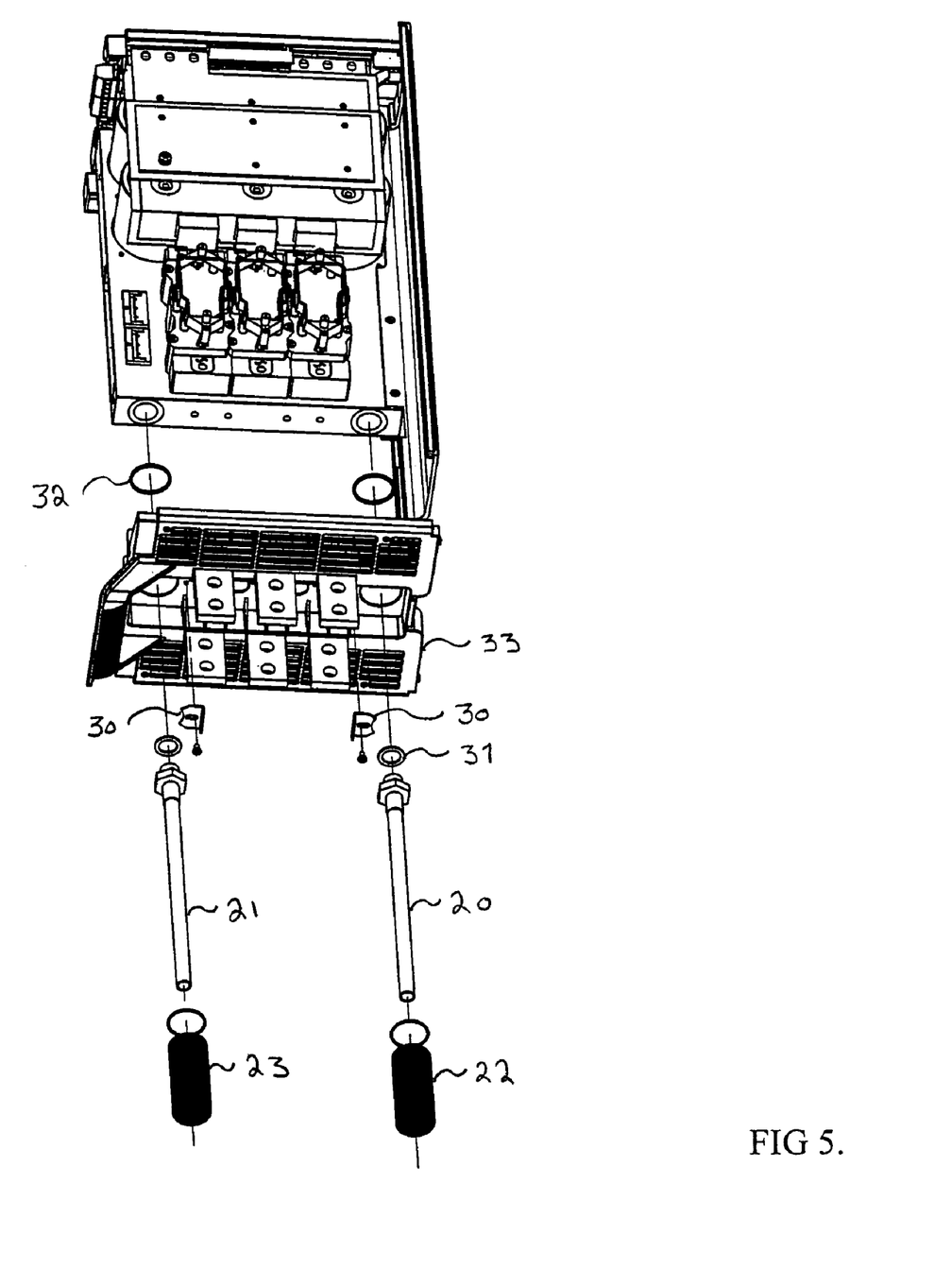
FIG. 5 is a partial view of connection arrangement of the liquid cooling element of the embodiment shown in FIGS. 1 to 3 and seen obliquely from front left.
Figure 6:
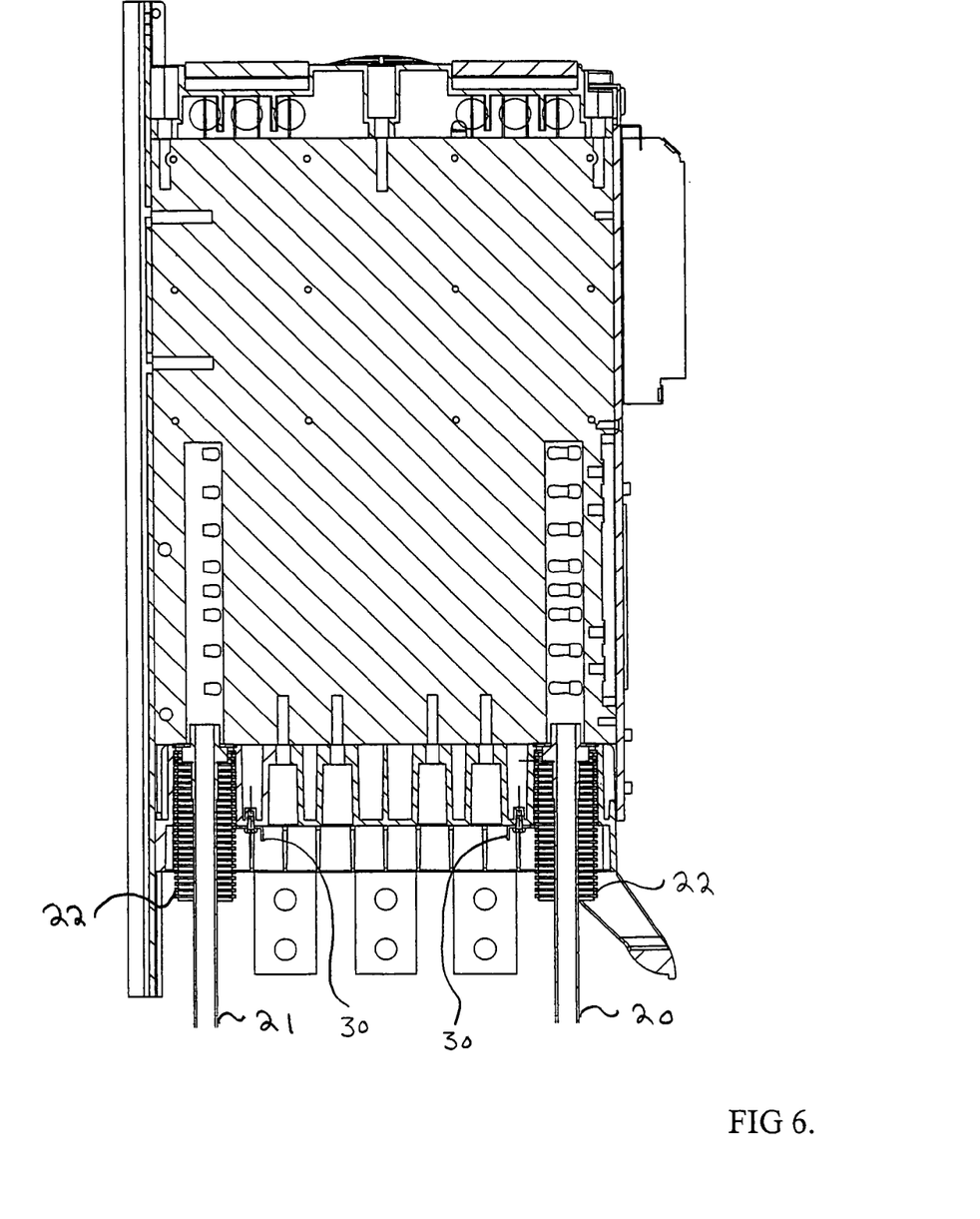
FIG. 6 shows a side view of the connection arrangement of FIG. 5 assembled.
Figure 7:
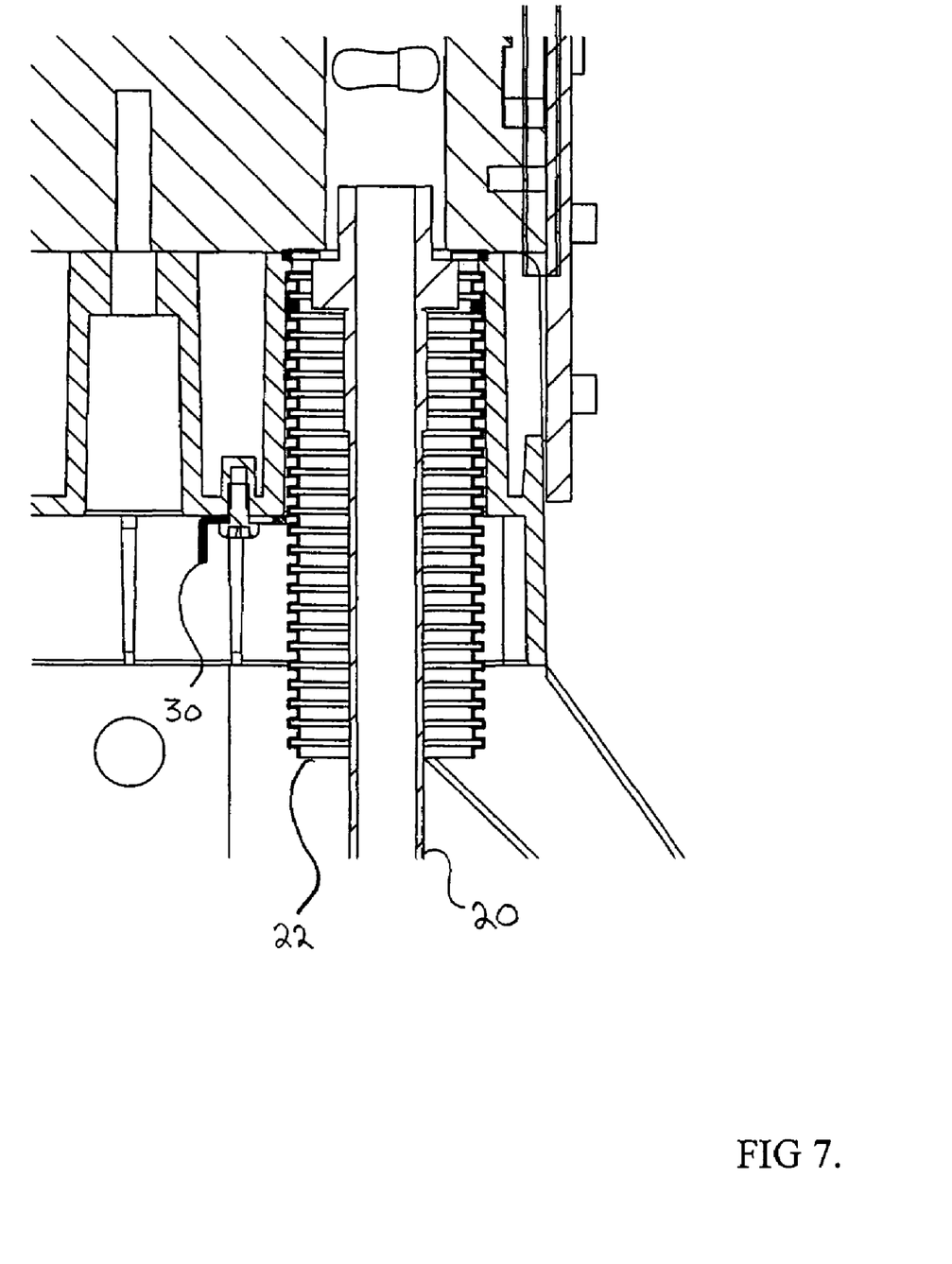
FIG. 7 shows the connection arrangement of FIG. 6 in partial enlargement.
Figure 8:
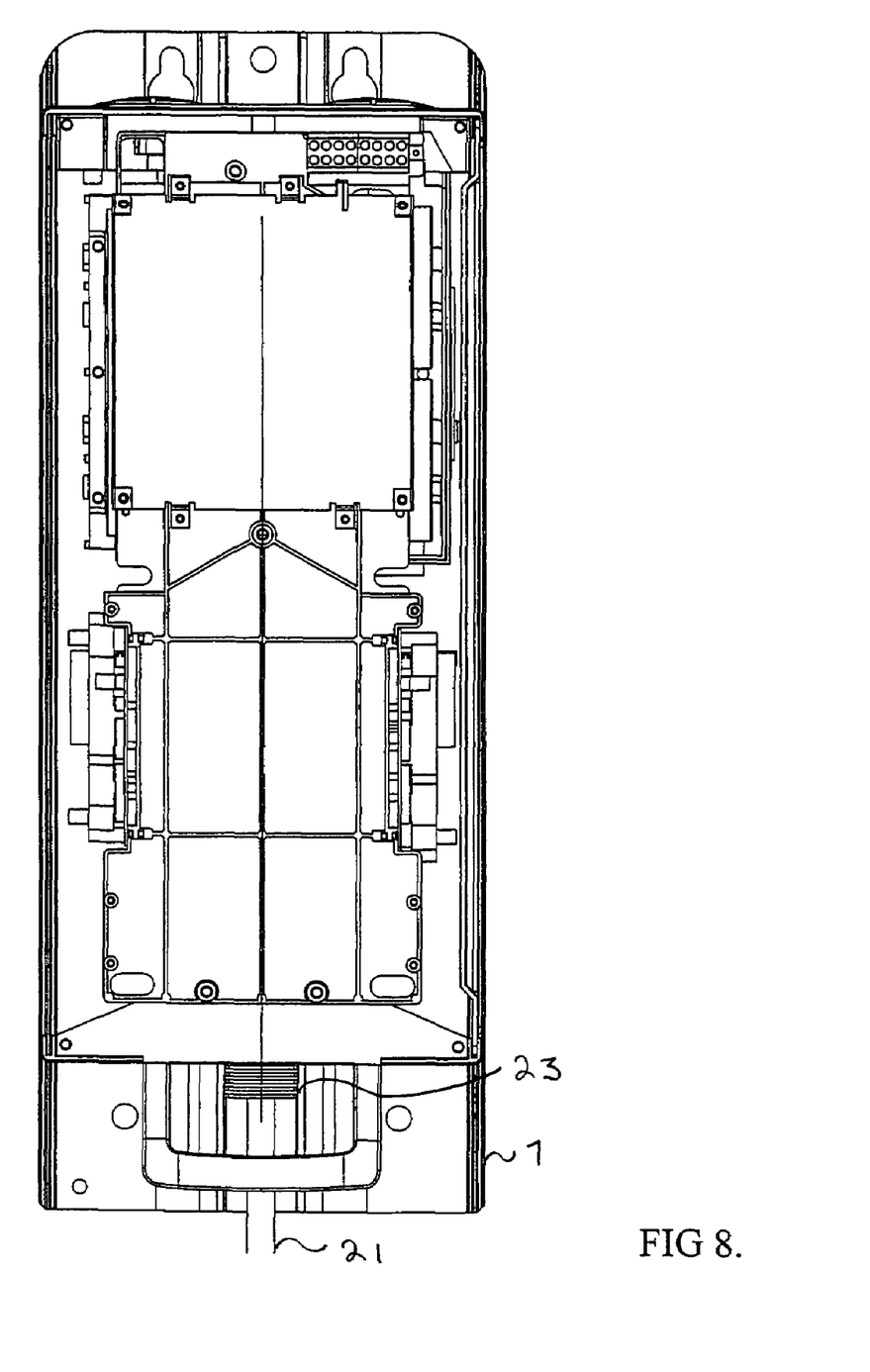
FIG. 8 is a top view of the connection arrangement of FIG. 6.

The liquid cooling element 2 consisting of one piece is made of heat conductive material, such as aluminium, and heat generating elements are connectable thereto as appears from FIGS. 5, 6 and 7. In addition to the operation of the above-described frame structure, the present structure is characterized by a simple, modifiable solution. For instance, the length and size of the horizontal channels 3, 4 can be modified to vary the flow. The number, diameter and positioning of the transverse channels 5 can also be readily modified in accordance with the placement of the cooling elements. In accordance with FIG. 1, the transverse channels 5 can be arranged in pairs with respect to the horizontal channels 3, 4 such that the outer edges of the transverse channel 5 extend closer to the lateral face 12 of the cooling element on both sides than the outer edge of the horizontal channel 3, 4.

It should be noted that the horizontal channels 3, 4 and the transverse channels 5 may also be in other than horizontal or vertical position with respect to their base. The essential thing is that the transverse channels 5 act as channels connecting the horizontal channels 3, 4.

Because the transverse channels 5 can be serviced through the maintenance cover 6, it is also possible to close some of the transverse channels 5 by placing in said transverse channel a piece (not shown), for instance an aluminium bar of suitable size, that blocks the flow in said transverse channel, if no cooling is desired in the area of those transverse channels. Thus, the flow increases in other channels, which enhances heat discharge from the element. This allows further improved focusing of the cooling of the elements. Advantageously the transverse channels 5 are arranged on both sides of the cooling element but they may be located on one side only, if elements to be cooled are positioned on one side of the cooling element only.

The cooling element 2 is large and provides sufficient mass for cooling. In addition, the walls between the cooling liquid and the electric elements must be sufficiently thick to resist the stresses, to which the walls are subjected. Sufficient thickness facilitates the securing of elements to be cooled, because the securing can be performed with screw-like securing means (not shown) that allow easy and safe securing. Previously, large size has been a drawback, but when the cooling element serves as the frame of the apparatus, it is possible to achieve a structure that is more robust and cools better than the previous frame structures without having to increase the size of the apparatus.

Because the applications and conditions vary, the need for cooling varies in different elements. Thus, there is also need to cool some parts more than others. To focus the cooling to critical areas would often be most desirable.

It should be noted that the cooling element itself may have a sufficiently large mass to cool smaller frequency converters. On the other hand, when the application environment is such that liquid cooling cannot be used, or there is a need to enhance it, a conventional cooling element, such as a cooling rib, can be readily secured to one side of the cooling element made of aluminium to enhance the cooling.

It should be noted that when the application environment is such that liquid cooling cannot be used, air from outside can also be readily conducted to the lateral faces of the cooling element made of aluminium or the pipe system thereof to enhance the cooling.

In the embodiment of connection arrangement of a cooling element shown in FIGS. 5 to 8, a second pipe 22, 23 is installed over the feed pipes 20, 21 used, by means of which second pipe leakage in the pipe or in a joint thereof can be detected without risking the operation of the apparatus. The outer protective pipe is shown only in part in the figures. In the connection arrangement of the liquid cooling the length of the protective pipe 22, 23 may vary according to need, but the intention is to lead the leaking water through the protective pipe 22, 23 into a sewage system. It is advisable to place the protective pipe both on the inlet and the outlet sides of the liquid. Installation applications often vary, whereby the liquid cooling pipes are often made of flexible material and sharp edges and the like may thus break them. The protective pipe may be made of plastic and thus it provides additional protection for the actual cooling pipe 20, 21.

The arrangement comprises horizontal channels 3, 4 for conducting the cooling liquid into the cooling element and away therefrom, and transverse channels 5 for connecting the horizontal channels. Around the pipes 20, 21 conducting the cooling liquid into the horizontal channels there are arranged a second, protective pipe 22, 23 having a larger diameter, which conducts the liquid in case of leakage to a desired distance from electrical devices.

In addition, FIGS. 5, 6 and 7 show an embodiment for sealing the outer pipe and securing it to a front panel, which in turn can be secured to the liquid cooling element 2, for instance, with screw-like means (not shown). The securing of the outer pipes 22, 23 can be implemented with a planar locking means 30 fitting into grooves in the outer pipe, which locking means prevents the outer pipe from moving in the longitudinal direction. The groove of the outer pipe 22, 23 can also be provided with one or more sealing rings 31. Between the front panel and the cooling element 2 it is also possible to arrange a sealing ring 32 as appears in FIG. 5.

It should be understood that the above description and the relating figures are only intended to illustrate the present invention. Thus, the invention is not restricted to the embodiment described above and defined in the claims, but it will be obvious to persons skilled in the art that the invention can be modified in a variety of ways within the scope of the accompanying claims defining the inventive idea.

The invention claimed is:

1. A unitary liquid cooling element for cooling heat generating parts of controllable electric drives, particularly of frequency converters, the cooling element comprising:
   horizontal channels for conducting cooling liquid into the cooling element and away from the cooling element;
   transverse channels for connecting the horizontal channels;
   a first sealing means for closing each traverse channel;
   and a second sealing means for covering and securing said first sealing means; wherein
   the transverse channels are arranged eccentrically with respect to the horizontal channels such that the longitudinal axis of the transverse channel is closer to a lateral face of the cooling element than the longitudinal axis of the horizontal channel, and wherein the transverse channels are arranged eccentrically to the horizontal channels such that the outer edge of the transverse channel extends closer to the lateral face of the cooling element than the outer edge of the horizontal channel.

2. The liquid cooling element as claimed in claim 1, wherein the transverse channels are perpendicular to a longitudinal direction of the horizontal channels and extend at their one end across a longitudinal axis of a second horizontal channel up to the outer edge of the cooling element.

3. The liquid cooling element as claimed in claim 1, wherein the transverse channels can be closed at the outer edge of the cooling element with a tightly arranged maintenance cover that can be secured to the cooling element.

4. The liquid cooling element as claimed in claim 1, wherein the cooling element is provided with a maintenance cover which is provided with sealing means.

5. The liquid cooling element as claimed in claim 1, wherein the cooling element is made of aluminium.

6. The liquid cooling element as claimed in claim 1, wherein the transverse channels are perpendicular to a longitudinal direction of the horizontal channels and extend at their one end over a second horizontal channel up to the outer edge of the cooling element.

7. A system for connecting a cooling element, the system being arranged to conduct heat generated in the electrical devices to an ambient space by means of the liquid circulating in the cooling device, the system comprising:
   horizontal channels for conducting the cooling liquid into the cooling element and away from the cooling element, and
   transverse channels connecting the horizontal channels, wherein
   a first pipe is situated for conducting cooling liquid into the horizontal channels and around which there is arranged a second pipe having a larger diameter, said second pipe being arranged to lead the cooling liquid in case of leakage to a desired location.

8. The system for connecting a liquid cooling element as claimed in claim 7, wherein between the liquid cooling element and the second pipe there is arranged a front panel.

9. The arrangement for connecting a liquid cooling element as claimed in claim 7, wherein the second pipe is secured to the front panel with a planar locking means.

10. The arrangement for connecting a liquid cooling element as claimed in claim 7, wherein the transverse channels are arranged in pairs with respect to the horizontal channels such that the outer edges of the transverse channels extend closer to the lateral face of the cooling element on both sides than the outer edge of the horizontal channel.

11. The arrangement for connecting a liquid cooling element as claimed in claim 8, wherein the second pipe is secured to the front panel with a planar locking means.

* * * * *